(12) United States Patent
Shohet et al.

(10) Patent No.: US 6,440,756 B2
(45) Date of Patent: Aug. 27, 2002

(54) REDUCTION OF PLASMA CHARGE-INDUCED DAMAGE IN MICROFABRICATED DEVICES

(75) Inventors: J. Leon Shohet, Madison, WI (US); Cristian Cismaru, Tustin, CA (US); Francesco Cerrina, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 09/735,991

(22) Filed: Dec. 13, 2000

Related U.S. Application Data
(60) Provisional application No. 60/170,340, filed on Dec. 13, 1999, now abandoned.

(51) Int. Cl.[7] .......... H01L 21/00; H01L 21/20; H01L 21/26; H01L 21/31
(52) U.S. Cl. .......... 438/4; 438/485; 438/513; 438/710; 438/788; 438/792
(58) Field of Search .......... 438/4, 485, 513, 438/710, 788, 792

(56) References Cited

U.S. PATENT DOCUMENTS

| | | | |
|---|---|---|---|
| 4,390,994 A | 6/1983 | Roberts et al. | 372/99 |
| 4,699,689 A * | 10/1987 | Bersin | 156/643 |
| 5,846,397 A | 12/1998 | Moustakas | 250/370 |
| 5,846,885 A | 12/1998 | Kamata et al. | 438/279 |
| 5,888,846 A | 3/1999 | Miyata et al. | 438/105 |
| 5,963,412 A | 10/1999 | En | 361/111 |

FOREIGN PATENT DOCUMENTS

| JP | 401064224 A | 3/1989 |
|---|---|---|
| JP | 401064224 * | 3/1989 |

OTHER PUBLICATIONS

Article entitled "Capillary Array: a new type of window for the vacuum ultraviolet," *Applied Optics*, vol. 18, No. 14, Jul. 15, 1979, by Lucatorto et al.

* cited by examiner

*Primary Examiner*—Alexander G. Ghyka
(74) *Attorney, Agent, or Firm*—Boyle Fredrickson Newholm Stein & Gratz S.C.

(57) ABSTRACT

A method and apparatus for reducing plasma-induced charging damage in a semiconducting device are provided. The method includes exposing an article having a dielectric material susceptible to plasma-induced charging, to vacuum-ultraviolet (VUV) radiation of an energy greater than the bandgap energy of the dielectric material during or after plasma processing of the device. The plasma-induced charge is conducted from, or recombined at, the charging site.

18 Claims, 7 Drawing Sheets

REDUCTION OF PLASMA CHARGE-INDUCED DAMAGE IN MICROFABRICATED DEVICES

CROSS REFERENCE TO RELATED APPLICATIONS

This application claims priority under 35 U.S.C. §119(e) to U.S. application Ser. No. 60/170,340, filed Dec. 13, 1999 now abandoned, entitled "Vacuum Ultraviolet Used to Minimize Processing Damage," the contents of which are hereby incorporated by reference.

The United States Government may have certain rights in the invention under National Science Foundation Grant No. EEC-8721545.

This invention was made with government support under Grant Number NSF 8721545 awarded by the National Science Foundation. The government has certain rights in this invention.

BACKGROUND OF THE INVENTION

The present invention is related to minimizing device damage during plasma assisted microfabrication. In particular, it relates to reducing charging damage of dielectrics during microfabrication processing.

The tendency in the art of fabricating integrated circuit (IC) devices is to achieve ever-higher integration (smaller dimensions). During fabrication, various materials are deposited and/or removed in different layers to build the desired integrated circuit. Typically, conductive layers are separated from one another by dielectric materials, e.g., $SiO_2$, and the like. Because semiconductor ICs are fabricated as multilayer structures, there is a common need to interconnect features on one layer with IC features on another. To form such interconnections between IC features, etching through the dielectric materials down to the underlying conducting feature, creates high-aspect ratio channels, typically.

In these instances, low-pressure, high-density plasma typically is used to micro-etch the IC device. When using a plasma in an etch or deposition process, a glow discharge produces a chemically reactive species from a relatively inert molecular gas, which then reacts with the material and either deposits on or etches the material. Any volatile by-products are then removed from the surface. The use of plasma in etching and deposition provides directionality, low temperature and processing convenience.

In such plasma-assisted IC structure patterning, the plasma is often biased with respect to the semiconductor wafer (substrate) to produce desired processing effects. As a result, an excess of positively or negatively charged particles may deposit on the substrate. If this excess deposits on dielectric material, it is likely that the net charge will continue to accumulate and produce an electric field across the dielectric, which can cause damage to the dielectric. Such charging damage may arise due to potential differences between floating gates and the silicon substrate due to plasma non-uniformities. In addition, a layer covered with resist or insulating film with apertures having a high aspect ratio is susceptible to a type of plasma charging damage known as electron-shading damage.

It is believed that electron-shading damage is caused by the difference in behavior between electrons and ions. In general, the semiconductor substrate and the plasma experience a bias potential (electric field) such that the positively charged ions are accelerated towards the substrate, whereas the electrons are decelerated in the electric field. As a result, the velocity of the positive ions becomes very large in the direction towards the substrate and ions are nearly vertically incident to the substrate on contact. In contrast, electrons have much larger angle of incidence to the substrate. This is illustrated in FIG. 1.

Where the conductive layer to be etched has an insulating or dielectric pattern thereon that surrounds the conductive surface, the electrons approaching in an oblique angle are shaded by the dielectric material and can be trapped in the walls of the channel. Ions of normal incidence, i.e., predominantly positive ions, are not shaded by the insulating pattern and are injected into the conductive layer below. This results in an overflow of positive charges into the conductive surface, as illustrated in FIG. 1.

As etching continues, electrons thus captured on the sidewalls of the dielectric layer serve to form an electric field that further repels incoming electrons. In contrast, the positively charged ions are accelerated by the electric field into the channel and onto the conductive surface below. This augments and exacerbates the charge difference between the top and walls of the trench, which can result in increased potential for damage.

Charging damage may arise in numerous ways. One common way occurs when tunneling currents pass through a gate-insulating film in connection with the conductive layer in order to discharge the accumulated charge, as shown in FIG. 1. When the gate-insulating film is thick, the tunneling current is negligible. However, with the higher integration of semiconductor devices, the thickness of the gate oxide films becomes smaller and tunneling current passes more easily and the quality and lifetime of the oxide is degraded.

As a result, dielectric charging can cause permanent damage to the devices being processed. In addition, dielectric charging can result in the degradation of processing properties of the plasma system, such as enhanced notching, trenching and sidewall bowing. Indeed, it has been the consensus among both the scientific and the industrial communities that plasma-process-induced damage is a growing concern in the microfabrication community. This phenomenon is now widely recognized as an important factor limiting yield and device reliability in microfabrication.

SUMMARY OF THE INVENTION

The present invention provides a method for the reduction of plasma charge-induced damage in microfabricated devices by reducing the extent of dielectric charging during plasma processing.

In one aspect of the invention, the method includes exposing an article containing a dielectric material that is susceptible to plasma-induced charging to vacuum-ultraviolet (VUV) radiation of an energy greater than the bandgap energy of the dielectric material during or after plasma processing of the article. The temporary increase in conductivity of the dielectric surface due to VUV exposure permits the plasma-induced charge to be conducted from the charging site, or alternatively, prevents charge accumulation in the first instance by allowing charge recombination at the charging site.

In one embodiment of the invention, a method for reducing plasma-induced charging damage in an article includes exposing an article comprising a dielectric material susceptible to plasma-induced charging, to vacuum-ultraviolet (VUV) radiation of an energy greater than the bandgap energy of the dielectric material during or after plasma processing of the article, whereby plasma-induced charging is reduced. The plasma-induced charge is conducted from, or recombined at, the charging site.

In another embodiment, the plasma-induced charge is conducted from the charging site, which may include establishing plasma conditions under which charge is conducted to the plasma or electrically connecting the charging site to ground.

In another embodiment of the invention, the plasma-induced charging is reduced by establishing VUV radiation exposure conditions under which charge recombination takes place at the charging site.

In other embodiments, the article comprises a dielectric material in contact with a conductive surface.

In still other embodiments, a plasma is generated in a plasma processing chamber containing the article, for which the plasma is a source of VUV radiation. In particular, the source of VUV radiation is an argon or oxygen plasma, or a secondary gas is introduced into a processing plasma, and the secondary gas forms a plasma emitting VUV radiation.

In other embodiments of the invention, the step of exposing the article to VUV radiation occurs after a plasma process is complete, or during plasma processing, or alternates with plasma-processing of the article.

In yet other embodiments of the invention, the VUV radiation source provides VUV radiation of an energy and/or flux density sufficient to conduct charge from the charging site, or the plasma has a VUV photon flux of greater than or equal to about $1 \times 10^{13}$ photons/cm$^2$-s, or the plasma has a VUV photon flux of greater than or equal to about 1 mW/cm$^2$.

In other embodiments, the VUV radiation is introduced into the plasma chamber separately from the processing plasma, such as by using a glass capillary array.

In another embodiment, a selected portion of the article surface is exposed to VUV radiation, which may be accomplished by masking the surface, or by exposure using glass capillary array of a selected size and shape.

In another aspect of the invention, an apparatus for reducing plasma-induced charging damage in an article is provided, which includes a plasma processing chamber for housing an article; means for generating a plasma; a source of vacuum-ultraviolet (VUV) radiation, in which the VUV radiation is of an energy greater than or equal to the bandgap energy of an article to be plasma processed.

In other embodiments, the apparatus includes conducting means for conducting plasma-induced charge from the article.

In still other embodiments, a plasma is generated in a plasma processing chamber, for which the plasma is a source of VUV radiation, and for example, the source of VUV radiation is an argon or oxygen plasma, or a secondary gas is introduced into the plasma chamber that forms a plasma emitting VUV radiation.

In other embodiments, the plasma is a pulsed plasma. In still other embodiments, the VUV radiation source provides VUV radiation of an energy and/or flux density sufficient to conduct charge from the charging site, and for example, the VUV radiation source is separate from the plasma chamber, or the VUV radiation is introduced from the VUV source into the plasma chamber using a glass capillary array.

The method of VUV-induced charge reduction is applicable to any process in which charge build-up occurs on a dielectric surface. Exemplary processes include metal and oxide plasma-assisted etching and plasma-assisted deposition of oxides, plasma doping, ion implantation, and plasma ashing.

BRIEF DESCRIPTION OF THE DRAWINGS

This invention is described with reference to the following figures, which are presented for the purpose of illustration and are in no way limiting of the invention, and in which.

DETAILED DESCRIPTION

The present invention demonstrates that dielectrics, such as $SiO_2$ and alumina, become temporarily conductive under direct plasma VUV exposure. The conductive oxide provides a path for safe discharging of charged surfaces, and may be especially useful for high-aspect ratio structures that charge up due to the electron-shading effect. By understanding the effects of both plasma charging and plasma radiation on the properties of the dielectric, changes in plasma processing conditions and methods are proposed to minimize processing damage to microfabricated devices.

According to the invention, a method for the reduction of dielectric charging in a device is accomplished by exposure of the device to vacuum-ultraviolet (VUV) radiation of an energy greater than the bandgap of the dielectric, either during or after plasma processing of the device. VUV radiation typically has a photon energy range between 9 eV and 25 eV; however, the energy spectrum depends upon the source of the radiation. For example, an argon plasma produces a large amount of VUV energy of about 12 eV, while an oxygen plasma has a large amount of VUV photon energy of about 9 eV. While not bound to any particular mode of operation, it is believed that a dielectric material may act as a photoconductor under these circumstances. Absorption of incident radiation of the proper energy results in electron-hole pair formation, and current flow is possible under an applied electric field.

Figure 1:
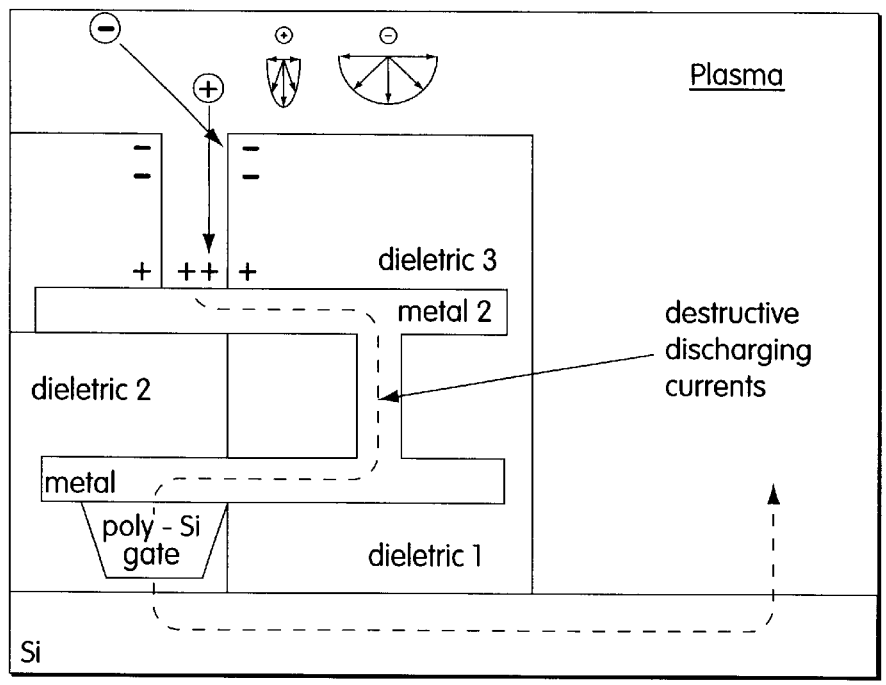
FIG. 1 is a schematic illustration of charging and discharging in an integrated circuit device.
Figure 2:
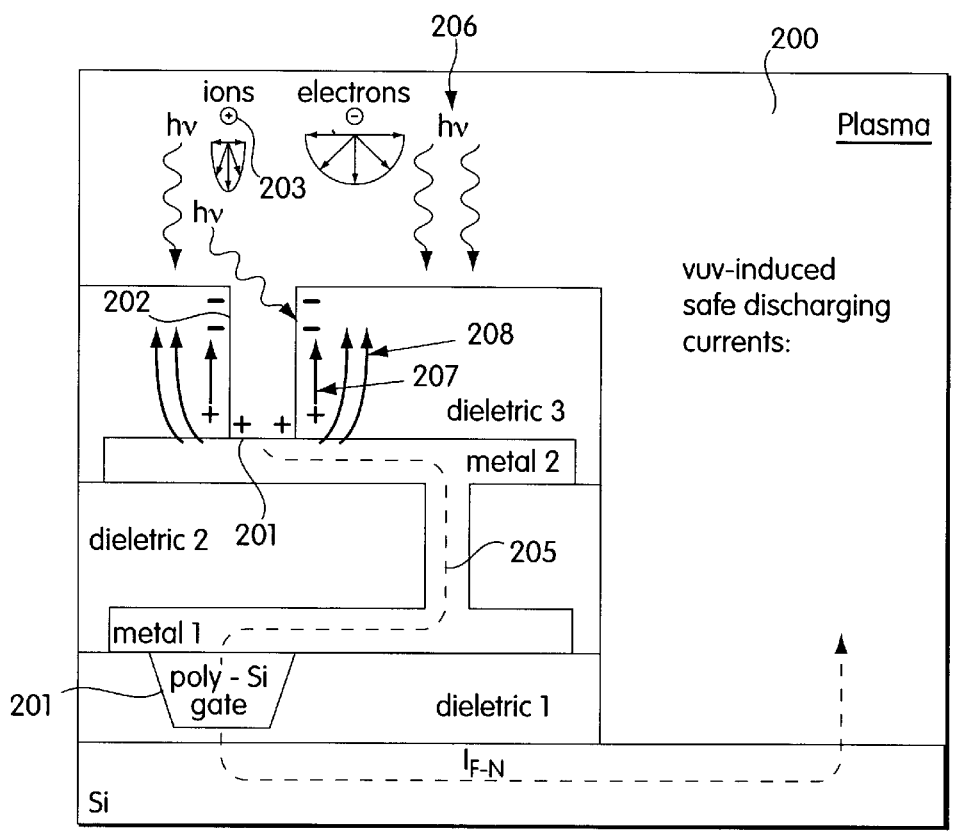
FIG. 2 is a schematic illustration of the proposed mechanism of the invention showing reduction of plasma-induced charging with vacuum-ultraviolet radiation.

This is illustrated schematically in FIG. 2, which shows a conventional gated integrated circuit 200, illustrating the electron shading effect during high aspect ratio etching of poly-silicon with a hardmask of $SiO_2$. As previously discussed, the conductive bottom 201 of the trench will charge more positively than the top sidewall 202 of the structure because of preferential impingement of the more anisotropic ions 203 onto the bottom of the trench. Most often, the conductive bottom is connected to a transistor gate 204, and this induces a voltage stress across the gate oxide. Charge build-up on surfaces of the device can result in deleterious discharging currents 205. In addition local electric fields determined by this differential charging may significantly perturb ion transport in the trench, thus reducing both ion energy and the ion flux arriving at the bottom of the surface.

Irradiation of the device with VUV radiation 206 temporarily increases the dielectric conductivity, permitting non-damaging discharge currents 207, 208. Discharge may arise through recombination of charges, such as at surface currents 207 along the sidewalls of the etched feature and through charge returned to the plasma through bulk currents 208. In other embodiments, a current drain, i.e., a conducting path to ground, may be included in the device to remove charge once the dielectric conductivity increases and current flow is established. It is reasonable to assume that, if a conducting path were placed on the edge of the VUV exposed region to ground, the charge would drain off as long as the VUV was turned on, thus providing a means to discharge the accumulated charge or to discharge it as soon as it accumulates on the dielectric.

Figure 3:
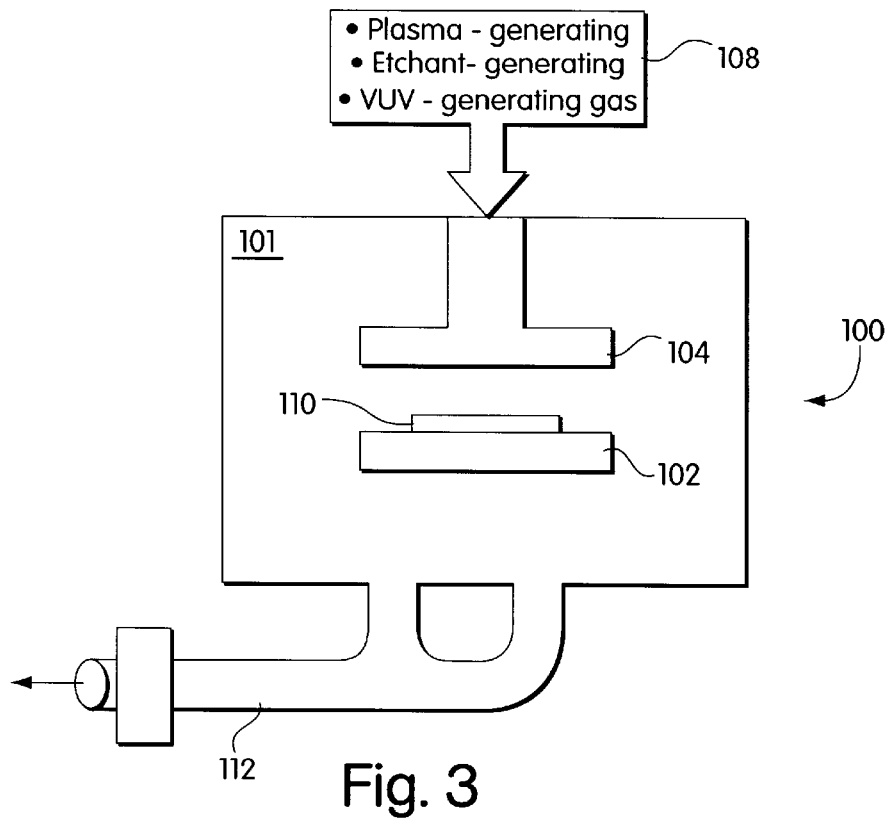
FIG. 3 is a cross-sectional illustration of an exemplary plasma chamber used in the practice of the invention.

FIG. 3 shows a plasma etching system 100 useful in the practice of the invention in accordance with one embodiment of the invention. The process chamber 101 includes a bottom electrode 102 and a top electrode 104, which also acts as a shower head for allowing input gas 108 to enter the processing chamber 101. In this manner, the plasma is located directly above a substrate containing the devices to be processed 110 that is placed on top of the bottom electrode 102. In operation, the processing chamber 101 may exhaust processing gases through a pumping system 112 that leads to an appropriate storage or exhaust of waste products (not shown). In operation, the device 110 is exposed to a plasma cloud that may result in charging of the device surfaces.

By way of example, the invention may be practiced in a number of other suitably arranged processing chambers that produce and/or deliver energy to the plasma. Examples of this include, but are not limited to, capacitively coupled electrode plates, electron cyclotron resonance (ECR) microwave plasma sources, and inductively coupled RF sources, such as helicon, helical resonators, and transformer coupled plasma (TCP).

Conductivity increases in the dielectric material can be achieved by use of a strongly VUV-emitting plasma. The VUV-emitting plasma may be used in combination with the other plasmas of the plasma process. For example, it may be combined with the processing plasma so that the device is exposed to VUV radiation during the plasma process itself. This may be accomplished by adding a secondary gas that has a high VUV emission to the plasma-forming gases. Exemplary gases having a high VUV emission are argon and oxygen. The preferred secondary gas for any particular application depends upon the particular dielectric materials of the substrate, since bandgap energies vary. By way of example, $SiO_2$, a common insulating mask used in the semiconductor industry, has a bandgap of about 9 eV. Other dielectrics used in semiconductor device manufacturing include silicon nitride ($Si_xN_y$) having a bandgap energy of about 6 eV and aluminum oxide ($Al_2O_3$) having a bandgap energy of about 8.3 eV.

In practice of the invention, the flux and/or photon density of VUV radiation to the charging surface should be sufficient to increase the conductivity of the surface and/or its bulk so that discharging currents may form. While conventional processing plasmas may generate a small level of VUV emission, it is considered inadequate to discharge the plasma-induced charge build-up in many devices. Conventional plasma provides photon flux in the VUV range of about 0.01 $mW/cm^2$. In preferred embodiments, the photon flux is greater than 0.01 $mW/cm^2$ and is preferably greater than or equal to about 1 $mW/cm^2$ or about $1 \times 10^{13}$ photons/$cm^2$-s. The minimum oxide conductivity needed to effectively discharge the dielectric depends on how much charge is present and how much time is available for discharge. Ideally, conductivity is sufficient that the charge decays as fast as it builds up, so the photon flux should be comparable with the plasma (charged particle) flux. In other embodiments of the invention, the device may be exposed to a plasma produced with an enhanced VUV emitting gas alone, either at the end of the processing step or in alternation with the processing gas plasma. By way of example, the VUV emitting gas plasma may be provided as a series of sequential pulsed discharges, with alternating pulses of processing gas plasma. Pulsing of the plasma system may take place by alternately puffing in measured amounts of processing gas and VUV-producing gas and separate plasma rf or microwave sources could also be alternately pulsed to specifically excite each particular gas. Apparatus and method of producing a pulsed plasma are known.

Alternatively, the device may be exposed to VUV-emission after conventional plasma processing. Preferably, exposure occurs during or immediately after plasma-processing to allow charge dissipation before damage to the device can occur.

In other embodiments, VUV irradiation of the device may be provided in a separate processing system. In some applications, it may be preferably to produce the VUV photons in a location remote from the location of plasma processing in order to avoid altering the plasma processing conditions. It also may be preferred to separate the relatively higher pressure plasma process from the low-pressure environment ideally suited to generation of VUV emissions. Traditional techniques for separating different pressure regions while transmitting VUV radiation include thin film windows and differentially pumped slits. For wavelengths between 800 Angstroms and 1050 Angstroms, thin films of indium may be used and at longer wavelengths, LiF is suitable. However for the wavelengths used in this invention, such windows are not normally usable.

Figure 4:
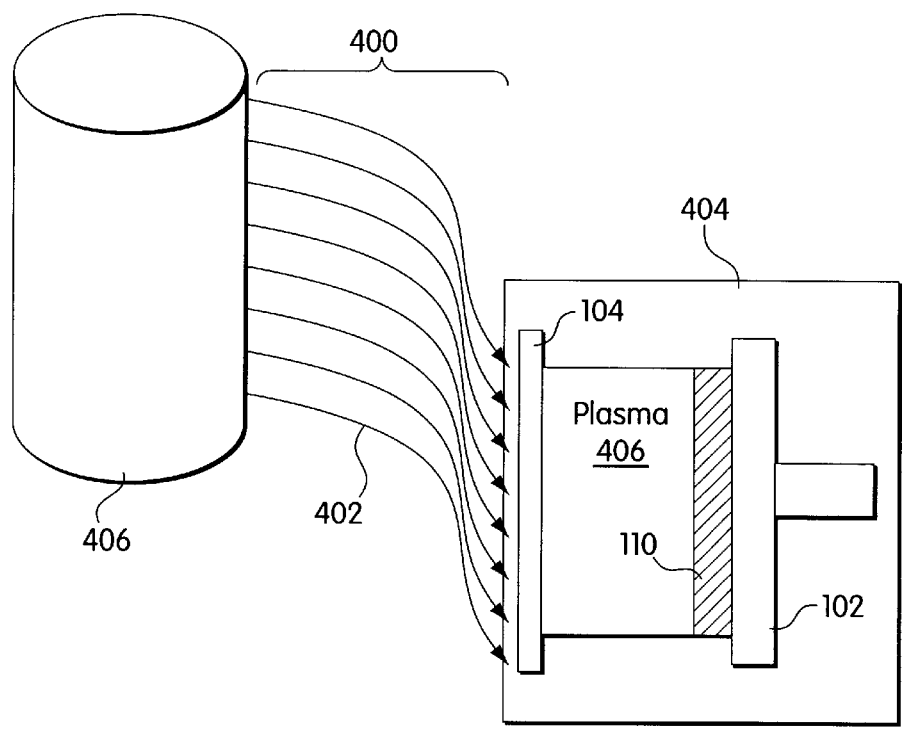
FIG. 4 is a schematic illustration of a glass capillary array used to separate VUV production from the plasma processing region.

A preferred embodiment includes the use of glass capillary arrays to provide a rugged, large aperture window for VUV emission. The flexible capillary glass tube array 400 is shown schematically in FIG. 4, and can be used to effectively separate the VUV source region from that of the plasma processing region. The array may be arranged to enter the plasma chamber 404 above the processing plasma 406, as is shown in FIG. 4. Each capillary tube 402 is a hollow glass waveguide and functions to guide the VUV photons into the plasma chamber 404. The arrays can be constructed to provide large light conductance while restricting the pressure differential between the VUV source 406 and the plasma chamber 404. A VUV capillary array 400 also provides added flexibility in the exposure of the device to VUV emission as the array may be oriented to cover the entire surface of the device or to focus on only portions of the device, for example, those regions considered most susceptible to plasma-induced charge damage. Typically, the VUV may be produced in a separate plasma discharge chamber specifically designed to generate enhanced VUV or it may be produced directly in the capillary arrays themselves (capillary discharge). When using a capillary array, a source of VUV may be a small, low-pressure, high-power, high-density inductively coupled plasma, running at the conventional 13.56 MHz.

By separating the VUV photon production region from the plasma processing region, each process can be separately controlled, thereby providing controllable VUV emission during plasma processing. Alternatively, VUV treatment may alternate with plasma processing or may be used after plasma processing completion. In addition to offering the ability to isolate the two processes from each other, this will permit integration of the VUV source with existing plasma processing systems, which offers significant cost advantages. It is believed that many commercially available plasma processing systems can be easily modified to include a capillary array. If the processing plasma deposits material on the capillary array, a shutter can be used to open the array to the substrate only during periods when the plasma is off. Suitable plasma processing systems include Applied Materials' Centura and eMAX platforms, LAM's 9000 Series etchers, and the like.

The method of the invention may be used with any insulating or dielectric material. Exemplary materials include, but are not limited to organic and inorganic resist materials used in patterning during plasma etching, and in particular, those dielectric materials used in the microfabrication and semiconductor industries. While the discharging capabilities of the invention have been discussed in light of processing of high aspect ratio features in the semiconductor industry, it will be appreciated that the method may be readily used for any plasma application where charge buildup may occur. For example, the method may find application in plasma sputter deposition processes where dielectric materials are deposited, and in particular, in alumina sputter deposition on magnetic recording heads, and also in plasma doping and ion implantation processes.

The invention is described with reference to the following examples, which are presented for the purpose of illustration and are not intended to be limiting of the invention.

EXAMPLE 1

This example measures the in situ electrical properties of $SiO_2$ films and demonstrates an increased conductivity of these layers during plasma exposure.

Figure 5:
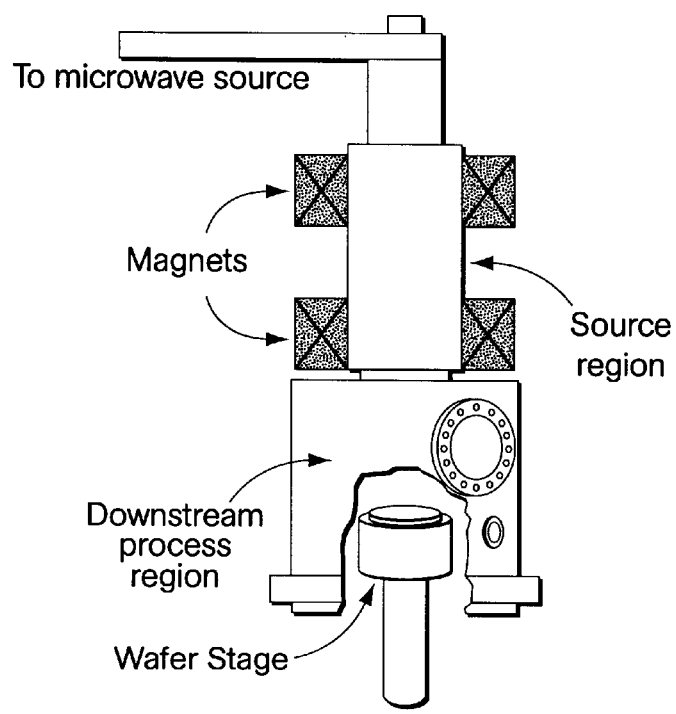
FIG. 5 is a schematic illustration of an electron cyclotron resonance (ECR) plasma etching system.

The method was implemented in an electron-cyclotron-resonance (ECR) plasma-etching system shown in FIG. 5. The system incorporated a 1.5 kW microwave plasma source and a pair of magnets arranged in a vertical magnetic-mirror configuration. The test structures used for these measurements were placed on a wafer stage that is located 19 cm below the electron-cyclotron-resonance region. For this work, the neutral pressure and microwave power were held constant at 2 mTorr and 1000 W, respectively. Either argon or oxygen was used as the feed gas. Under these conditions, plasmas with densities in the $10^{11}$ to $10^{12}$ $cm^{-3}$ range were obtained. No wafer bias was applied.

Device preparation. The test structure and its electrical circuitry is shown in FIG. 6. This test structure and its associated measurements provided the current-voltage relationship between the current passing through the thin oxide layer and the voltage drop across it, even though a direct measurement of the voltage drop is not made. The measurements provide a good measurement of bulk conductivity, regardless of oxide thickness.

Figure 6A:
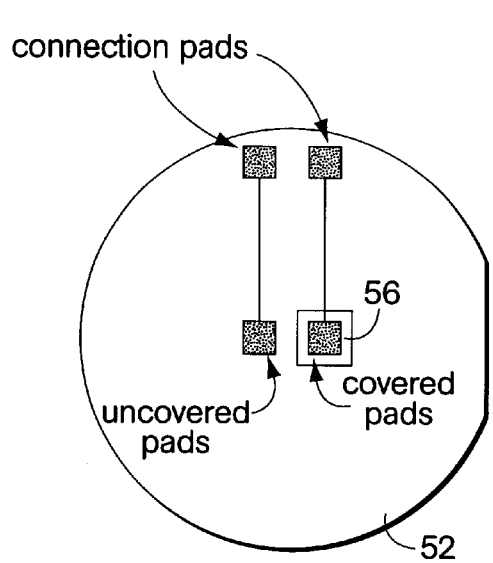
FIG. 6 is (A) a diagram of a test structure used in Example 1 and (B) the associated measurement circuitry.
Figure 6B:
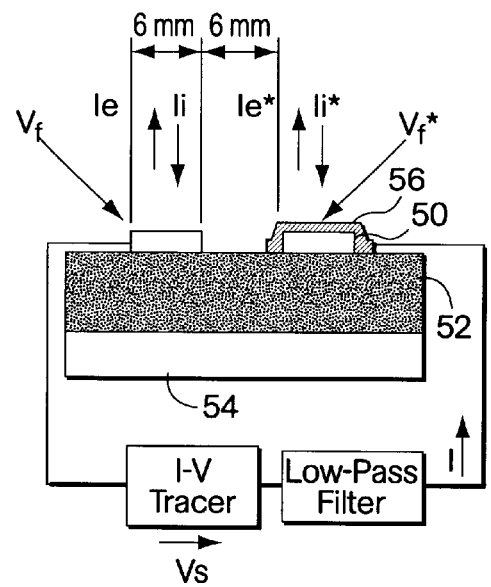

With reference to FIGS. 6A–6B, the test structure was prepared as follows. A 5.8×5.8 mm Al pad 50 was deposited on top of 1 μm thick thermally grown silicon oxide 52 on an Si wafer 54 (n-type, 1 Ω-cm). The Al pad is covered with a thin layer 56 of PECVD-deposited (plasma-enhanced chemical vapor deposition) $SiO_2$ of varying thicknesses, which is the layer to be tested. For the purposes of this example, three separate sets of test structures of this kind were built (on separate wafers), with PECVD oxide thicknesses (as measured after deposition) of 570, 690 and 2925 Å. The nonuniformity of each thickness was less than 5% across the surface of the wafers. The equivalent electric circuit for the measurement setup in FIG. 6B is shown in FIG. 7.

Measurement of the J-V characteristics and oxide conductivity of thin $SiO_2$ layers directly exposed to plasma radiation. The $J_{ox}$ vs $E_{ox}$ relationship was obtained through the dielectric layer by making the following measurements, and applying the extracted measurements to the equation, $$J_{ox} = C \frac{\varphi}{t_{ox}} E_{ox} \; [A/cm^2] \qquad (eq\ 1)$$

Figure 7:
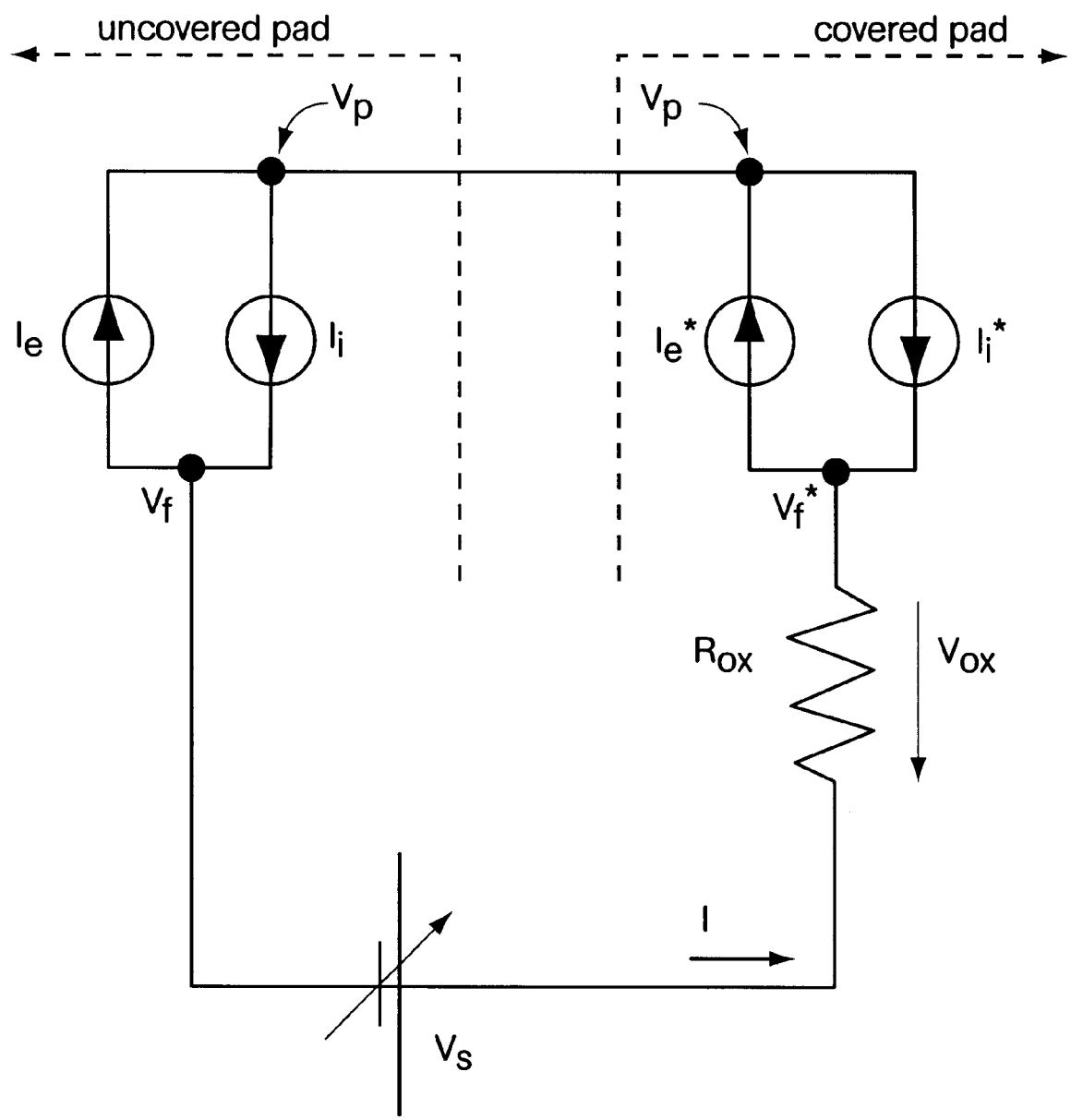
FIG. 7 is an equivalent electrical circuit for the measurement setup of FIG. 6.
Figure 8A:
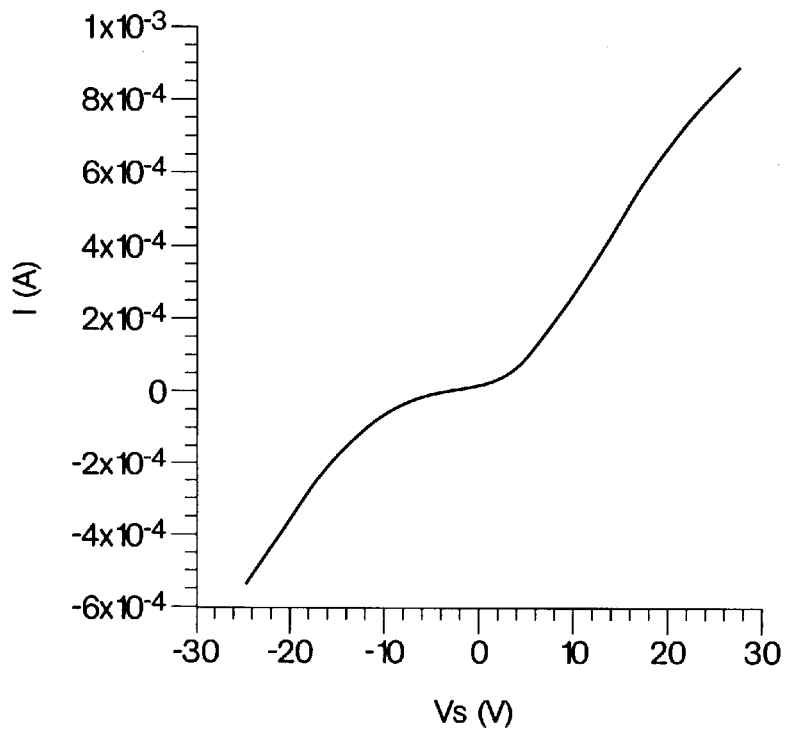
FIG. 8 is (A) an exemplary I-V measurement on the 690 Angstrom thick oxide-covered Al pad and (B) a Langmuir probe measurement on the uncovered Al pad for an $O_2$ plasma at 1000 W microwave power and 2 mTorr neutral pressure.
Figure 8B:
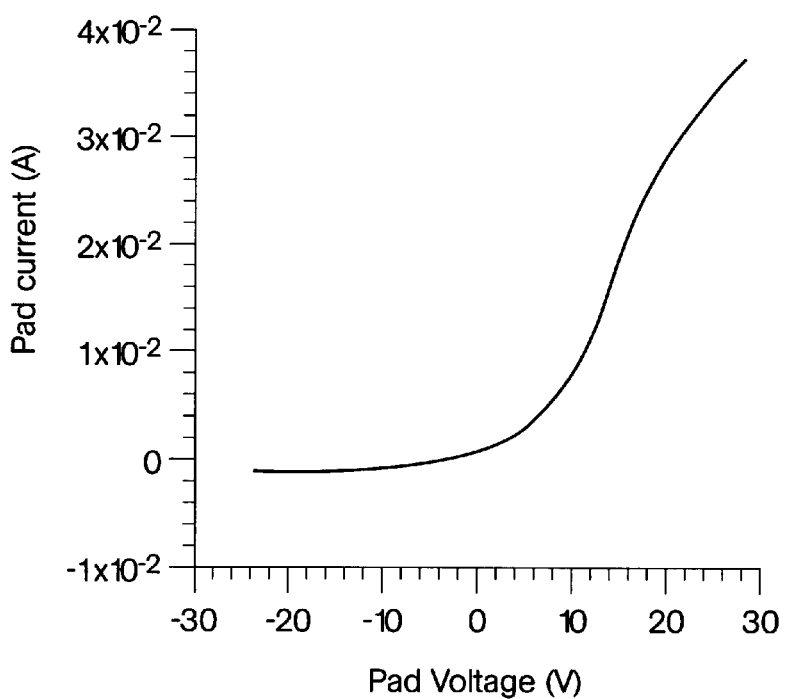

First, a measurement of the current I as a function of $V_s$ was made between −10 and 10V in the setup of FIGS. 6 and 7. One example of this measurement is shown in FIG. 8A. Next, a Langmuir probe measurement using the uncovered pad is made so as to extract the electron temperature $T_e$ and the electron current $I_e$. The electron current is extracted as a function of the pad's floating potential $V_f$. An example of the Langmuir probe measurement is given in FIG. 8B. To relate the electron current $I_e$ to the source voltage $V_s$ as in the above equation, a measurement of $V_f$ during the sweep of $V_s$ was also made. The measurement of $V_s$ vs $V_f$ was made using a high-voltage probe with an impedance of 10 MΩ connected to the uncovered Al pad. Thus, the I-V relationship for the oxide layer was determined; and the $J_{ox}$-$E_{ox}$ relationship was determined by subsequently dividing the current I by the pad area and the oxide voltage drop $V_{ox}$ by the oxide thickness.

Figure 9:
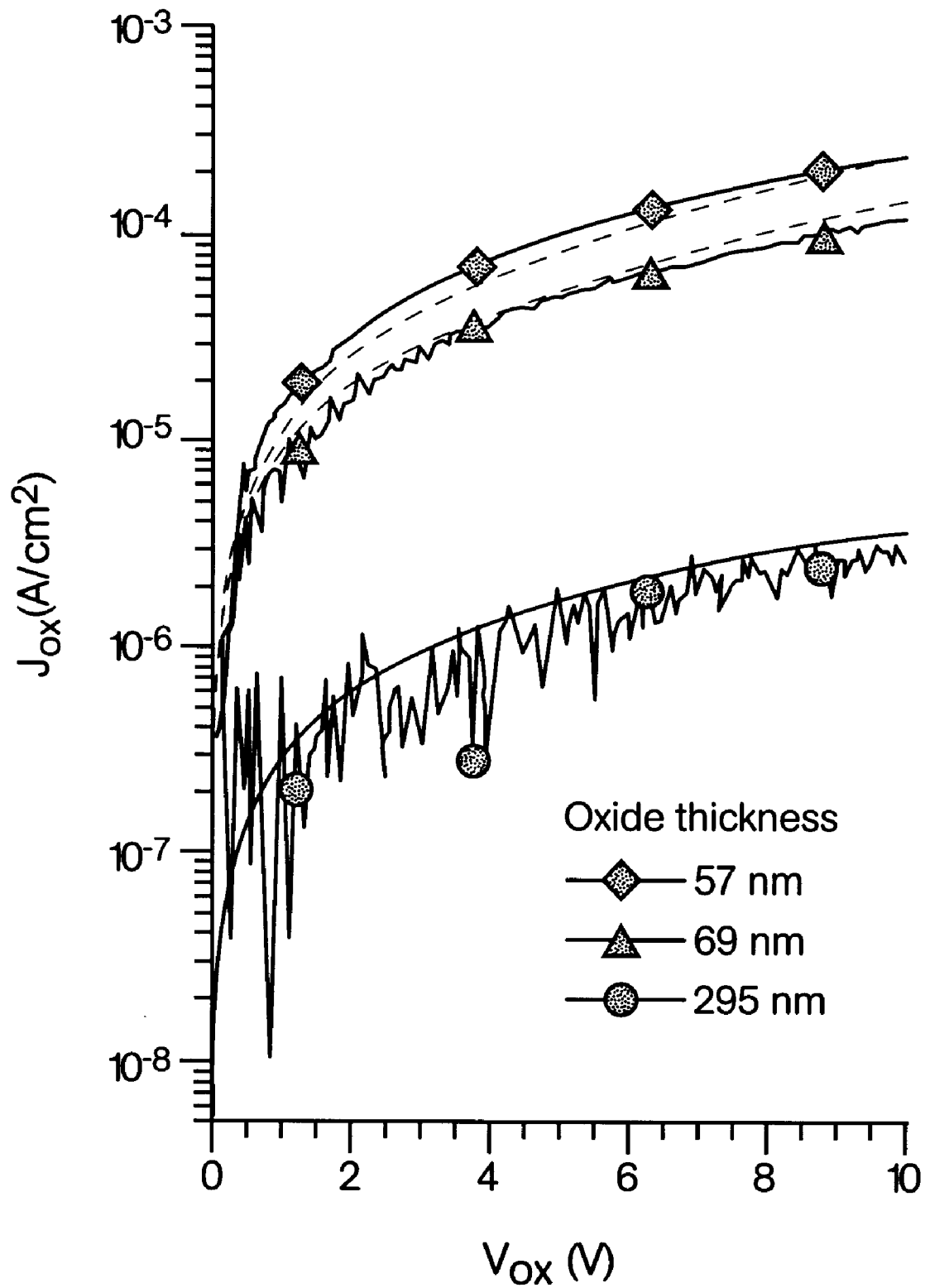
FIG. 9 is a plot of VUV-induced current density (solid lines) and fitted values (dashed lines) as a function of applied voltage across the oxide layer for layer thicknesses of 57 nm (♦), 69 nm (▲) and 295 nm (●)

Based on these measurements, measurements of the J-V characteristics of thin $SiO_2$ layers were made during exposure to argon and oxygen plasmas at 1000 W microwave power and 2 mTorr neutral pressure. Examples of these measurements are shown in FIG. 9 for different oxide thicknesses of 57 nm (♦), 69 nm (▲) and 295 nm (●), which show the measured current density across the oxide layer during exposure to an Ar plasma.

The measured data can be fitted to a simple photoconductor model to determine the conductivity of $SiO_2$ layers under exposure to plasma radiation. The model has been described previously (Cismaru & Shohet, *Journal of Applied Physics*. 88(4):1742 (Aug. 2000) and U.S. Ser. No. 60/170,340 entitled "Vacuum Ultraviolet Used to Minimize Processing Damage," which are hereby incorporated by reference. This model is based on the current density expression:

$$-J_{ox} = C \frac{\varphi}{t_{ox}^2} V_{ox} e^{\xi(V_{ox}/t_{ox})}, \qquad (eq\ 2)$$

where $\varphi$ is the ionizing radiation flux with energies higher than the energy band gap of $SiO_2$ (approximately 9 eV), $E_{ox}$ is the electric field strength across the oxide layer ($E_{ox}=V_{ox}/t_{ox}$), $t_{ox}$ is the oxide thickness and C is the fitting parameter. The radiation flux was measured to be $3.6 \times 10^{14}$ photons/cm$^2$ for argon and $5.1 \times 10^{13}$ photons/cm$^2$ for oxygen in the ECR etcher, at 2 mTorr and 1000 W microwave power.

This leads to a conductivity that depends on the applied electric field according to the following expression:

$$\sigma_{ox} = C \frac{\varphi}{t_{ox}^2} e^{\xi E_{ox}} \; [\Omega^{-1} cm^{-1}]. \qquad (eq\ 3)$$

The values of the parameters C and $\xi$ were determined for both argon and oxygen by fitting the experimental data to the model defined in eq. 2, which are shown as dashed lines. The standard error of the fitting parameters C and $\xi$ was less than 3%. Similar measurements were made for oxygen plasma under similar conditions. Values of the fitting parameters for argon and oxygen plasma are reported in Table 1.

| Feed gas | C (cm$^2$-s-$\Omega^{-1}$) | $\xi$ (cm V$^{-1}$) |
|---|---|---|
| Ar | $9.6 \times 10^{-31}$ | $4.7 \times 10^{-7}$ |
| O$_2$ | $8.9 \times 10^{-30}$ | $8 \times 10^{-7}$ |

Based on these measurements, oxide conductivity was determined for an $SiO_2$ layer of varying thickness upon exposure to Ar plasma. The measurements of the oxygen conductivity resulted in values in the range of $10^{-10}$ to $10^{-9}$ $\Omega^{-1}$-cm$^{-1}$ during argon and oxygen exposure, respectively. The higher oxide conductivity induced during exposure to oxygen plasma is due to the stronger emission of this plasma near the $SiO_2$ bandgap energy (ca. 9 eV). In contrast, argon plasma has most of its VUV emission at higher energies (ca. 12 eV). The lower energies photons emitted by the oxygen plasma will penetrate more deeply into the $SiO_2$ layer, inducing the generation of electron-hole pairs through the oxide, while the higher energy photons emitted by the argon plasma will penetrate only a few hundred angstroms and will generate electron-hole pairs in this outermost layer only. Therefore it is expected that the conductivity of the oxide layers or more than a few hundreds of Angstroms thick will be higher under an oxygen plasma than under an argon plasma exposure.

Measurement of the J-V characteristics and oxide conductivity of thin $SiO_2$ layers before and after plasma exposure. The oxide conductivity measured in situ during plasma exposure was compared to the conductivity measured before and after the exposure, under complete darkness. To make these measurements after the plasma exposure, another aluminum layer was added on top of the PECVD oxide layer by magnetron sputtering, followed by a 20 minute metal anneal step at 425° C. in forming gas. The I-V curves recorded between the upper and lower Al layers before and after plasma exposure showed conductivities three orders of magnitude lower than that measured under plasma exposure. These results demonstrate that oxide conductivity can be made to increase dramatically under exposure to plasma containing significant levels of VUV radiation.

EXAMPLE 2

This example measures the in situ electrical properties of another dielectric material, $Al_2O_3$, and demonstrates an increased conductivity of these layers during plasma exposure. This demonstrates that the observed increase in conductivity during VUV exposure may be generally applied to a variety of dielectric materials.

Monochromatic synchrotron VUV radiation was used having the same photon energy range as a conventional plasma. The advantage of using synchrotron radiation is the ability to determine the dependence of measured quantities on the wavelength of incoming radiation. Oxide-coated wafers were exposed to synchrotron radiation at the Synchrotron Radiation Center (SRC) at the University of Wisconsin-Madison. The monochromatic light was supplied by the Aladdin synchrotron storage ring, passing through a VUV monochromator. The electron beam used to generate the synchrotron radiation had a current of up to 250 mA, at an energy of 800 MeV. The VUV monochromator that was connected to the beamline is a normal-incidence monochromator, in a Seya-Namioka mount, with an output energy range of 4 eV to 30 eV, and a bandpass of 3 Å.

An oxide layer was deposited on the wafer substrate by reactive sputtering and was 3000 Angstroms thick. The oxide-coated samples were mounted in a vacuum chamber coupled to the beamline monochromator. The mounting unit was set so as to have normal incidence of VUV beam on the surface of the wafer. The monochromatic synchrotron light was focused on the sample with a spot of dimension 5 mm×15 mm. During the measurements, the chamber was evacuated to pressures in the $10^{-8}$ Torr range.

Figure 10:
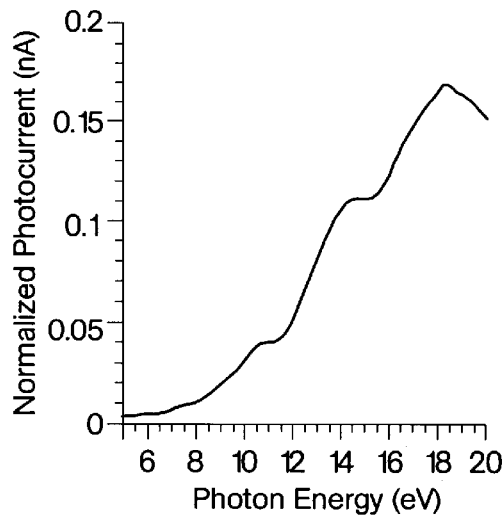
FIG. 10 is a plot of the normalized net conduction current as a function of incident photon energy for an aluminum oxide layer.

The current through the oxide sample was measured at a fixed bias voltage, 45 V, as the synchrotron light energy was varied between 5 and 20 eV. The dark current was measured by closing off the light source, but making the same sweep of energy to make sure that there were no light leaks or other coupling to the circuit. In all cases, the dark current was at least one order of magnitude less than the conduction current. The net oxide current (measured current less dark current) was normalized to a constant electron beam current (200 mA) and the photon flux at 15 eV. The normalized net conduction current as a function of incident photon energy is shown in FIG. 10. No significant increase in conduction current took place until the VUV photon energy approached the bandgap energy of the aluminum oxide at around 8.32 eV.

Figure 11A:
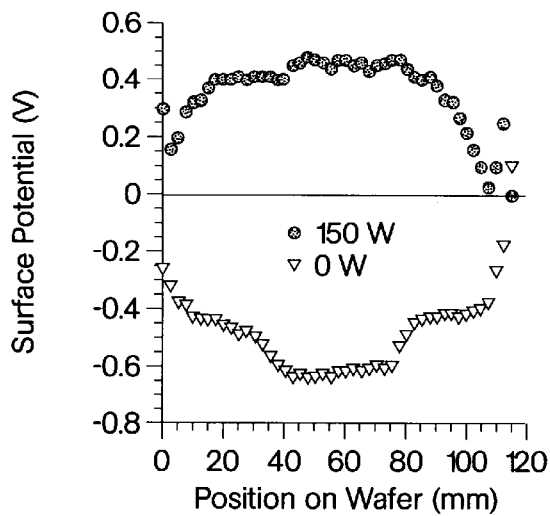
FIG. 11 is surface potential scan of a wafer showing surface potentials (A) after positive and negative charging, but before VUV exposure and (B) the positively charged wafer after VUV exposure.

In order to test the effect of VUV radiation on depletion of charge, the samples were charged by placing them in a non-reactive argon inductively coupled plasma (ICP) for several minutes. The ICP power was 1 kW and two different sample bias conditions were used so as to produce a net positive or negative charge in the oxide. The former was achieved with 150 W RF bias and the latter with a zero bias. FIG. 11A shows a scan across the 11.5 cm sample using the CPD (contact potential difference) technique that was made before exposure to the VUV under both sample biases.

Figure 11B:
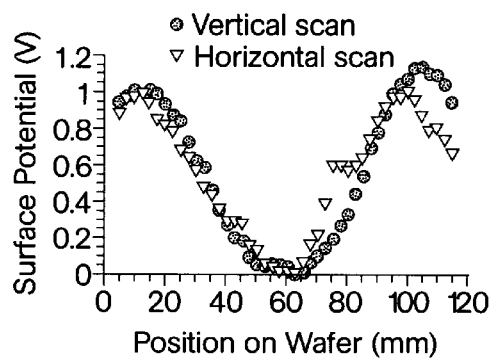

Since most plasma processing occurs with a positive charge being placed on the wafer, a CPD scan of a positively charged wafer was made after exposure to VUV, which is shown in FIG. 11B. Three VUV exposures were made on the sample at 15 eV for 5, 30 and 300 seconds. The first exposure was made at the exact center of the sample, while the remaining two were displaced above and below the center by about 10 mm. Two CPD scans at right angles to each other show a dramatic change in the charge profiles. There was a significant decrease in the charge at the center of the sample and an increase in charge towards the outside of the wafer. The temporary increase in conductivity in the center made this region an equipotential and charge flowed outward from the central region of exposure to the outside, pushing other charge ahead of it and resulting in a charge pile-up at the wafer edges. When VUV exposure is ended, the conductivity returns to its pre-exposure state, thus trapping the charge as shown in FIG. 11B. It is reasonable to assume that, if a conducting path were placed on the edge of the VUV exposed region to ground, the charge would drain off as long as the VUV was turned on, thus providing a means to discharge the accumulated charge.

OTHER EMBODIMENTS

All publications and patent applications mentioned in this specification are herein incorporated by reference to the same extent as if each independent publication or patent application was specifically and individually indicated to be incorporated by reference.

What is claimed is:

1. A method for reducing plasma-induced charging damage in an article, the article including a dielectric material susceptible to plasma-induced charging, comprising the steps of:

exposing the article to a user desired processing plasma such that the dielectric material undergoes a plasma-induced charging; and exposing the article to vacuum ultraviolet (VUV) radiation of an energy greater than the bandgap energy of the dielectric material during or after the step of exposing the article to the user desired processing plasma in order to reduce the plasma-induced charge in the dielectric material.

2. The method of claim 1, wherein the dielectric material includes a charging site and wherein the method includes the additional step of:

conducting the plasma-induced charge from the charging site.

3. The method of claim 2, wherein the step of conducting the plasma-induced charge from the charging site includes establishing plasma conditions under which charge is conducted to the plasma.

4. The method of claim 2, wherein the step of conducting the plasma-induced charge from the charging site comprises electrically connecting the charging site to ground.

5. The method of claim 1, wherein the dielectric material includes a charging site and wherein the plasma-induced charging is reduced by establishing VUV radiation exposure conditions under which charge recombination takes place at the charging site.

6. The method of claim 1, wherein the dielectric material of the article is in contact with a conductive surface.

7. The method of claim 1, wherein the user desired processing plasma is generated in a plasma processing chamber containing the article, said plasma being a source of VUV radiation.

8. The method of claim 7, wherein the source of VUV radiation is an argon or oxygen plasma.

9. The method of claim 7, wherein a secondary gas is introduced into the user desired processing plasma, said secondary gas forming a plasma emitting VUV radiation.

10. The method of claim 1, wherein the step of exposing the article VUV radiation alternates with the step of exposing the article to the user desired processing plasma.

11. The method of claim 1, wherein the VUV radiation source provides VUV radiation of an energy and/or flux density sufficient to conduct charge from the charging site.

12. The method of claim 1, wherein the user desired processing plasma has a VUV photon flux of greater than or equal to about $1 \times 10^{13}$ photons/cm$^2$-s.

13. The method of claim 1, wherein the user desired processing plasma has a VUV photon flux of greater than or equal to about 1 mW/cm$^2$.

14. The method of claim 7, wherein the VUV radiation is introduced into the plasma chamber separately from the user desired processing plasma.

15. The method of claim 1, wherein VUV radiation is introduced using a glass capillary array.

16. The method of claim 1, wherein a selected portion of a surface of the article is exposed to VUV radiation.

17. The method of claim 16, wherein exposure of the selected portion of the surface of the article is accomplished by masking the surface.

18. The method of claim 16, wherein exposure of the selected portion of the surface of the article is accomplished by VUV radiation exposure using glass capillary array of a selected size and shape.

* * * * *